United States Patent [19]

Foss

[11] 4,423,325
[45] Dec. 27, 1983

[54] MULTI-SPECTRAL SCHOTTKY BARRIER INFRARED RADIATION DETECTION ARRAY

[75] Inventor: Norman A. Foss, North Oaks, Minn.

[73] Assignee: Honeywell Inc., Minneapolis, Minn.

[21] Appl. No.: 298,568

[22] Filed: Sep. 2, 1981

[51] Int. Cl.³ .......................... H01J 31/49; G01T 1/22
[52] U.S. Cl. ...................................... 250/332; 250/370
[58] Field of Search ............... 250/330, 332, 338, 370, 250/371; 357/15, 24 LR, 29, 30; 358/113

[56] References Cited

U.S. PATENT DOCUMENTS

| | | | |
|---|---|---|---|
| 3,743,995 | 7/1973 | Riedl et al. | 250/370 |
| 3,806,633 | 4/1974 | Coleman | 358/113 |
| 4,054,797 | 10/1977 | Milton et al. | 250/332 |
| 4,228,365 | 10/1980 | Gutierrez et al. | 357/15 |

Primary Examiner—Janice A. Howell
Attorney, Agent, or Firm—Charles J. Ungemach

[57] ABSTRACT

A multi-spectral Schottky barrier infrared detector array in which individual pixels of radiation from a remote radiating object are detected by two or more Schottky barrier infrared radiation detectors each having a different spectral response so as to provide a "color" discrimination for the array.

10 Claims, 2 Drawing Figures

MULTI-SPECTRAL SCHOTTKY BARRIER INFRARED RADIATION DETECTION ARRAY

BACKGROUND OF THE INVENTION

In the field of infrared radiation detection, a type of detector referred to as a Schottky barrier or Schottky diode detector is known. An infrared array utilizing such detectors is described in U.S. Pat. No. 3,902,066 issued to Sven A. Roosild et al on Aug. 26, 1975. Schottky barrier detectors may be composed of a variety of materials such as palladium, platinum or iridium which can be fabricated on a base such as silicon by vacuum deposition and then annealed to form a silicide of various barrier heights depending upon the material. For example, palladium silicide on p-type silicon produces a barrier height of about 0.35 ev, platinum silicide produces a barrier height of about 0.27 ev and iridium silicide, which is disclosed and claimed in a copending application of Daryl L. Smith, Ser. No. 298,567, filed Sept. 2, 1981 produces a barrier height of approximately 0.21 ev. Because of the difference in barrier height, the various Schottky barrier detectors provide different wavelength responses to infrared radiation (3.5 microns for palladium silicide, 4.6 microns for platinum silicide and 5.9 microns for iridium silicide).

In the above-mentioned Roosild patent, the detecting array is composed of a number of Schottky barrier detectors all of the same type so as to provide an image of a heat radiating body located remotely from the detector array.

The present invention is an improvement on the detector array shown by the Roosild patent wherein each unit detector or pixel, rather than being composed of a single Schottky barrier detector type, is composed of two or more Schottky detector barrier detectors of different response characteristics. Utilizing two or more different kinds of Schottky barrier detectors in each individual pixel allows, for example, the separation of various "color" components in the received radiation from the remote object and thus provides the ability for spectral separation useful in target discrimination. With the discrimination provided by using different kinds of Schottky barrier detectors in a single array, the system will be able to differentiate between, for example, tactical targets and decoy targets which typically have different spectral signatures.

In a preferred embodiment of the present invention, a three color system will be shown utilizing palladium silicide, platinum silicide and iridium silicide formed on p-type silicon to provide a three color system. Use of these materials allows the array to be formed by vacuum deposition of the various metal layers on the silicon and annealing the whole unit at the same time since the annealing schedule for each of the described silicides is nearly identical; i.e., about one hour at a temperature of between 300 and 400 degrees centigrade. Therefore, the array may be fabricated simultaneously. Furthermore, the spectral responses of these detectors make the array sensitive to the very desirable infrared "window" between 3 and 5 microns in wavelength. Of course, other detector materials may be found having these desirable characteristics and the use of palladium, platinum and iridium silicides on p-type silicon should be considered only an example of the preferred embodiment.

SUMMARY OF THE INVENTION

The purpose of the present invention is to provide an infrared detector array composed of Schottky barrier detectors in which individual detectors in each unit pixel are composed of different materials so as to provide different spectral responses and thus produce a "color" sensitive infrared detector array.

DETAILED DESCRIPTION OF THE PREFERRED EMBODIMENT

Figure 1:
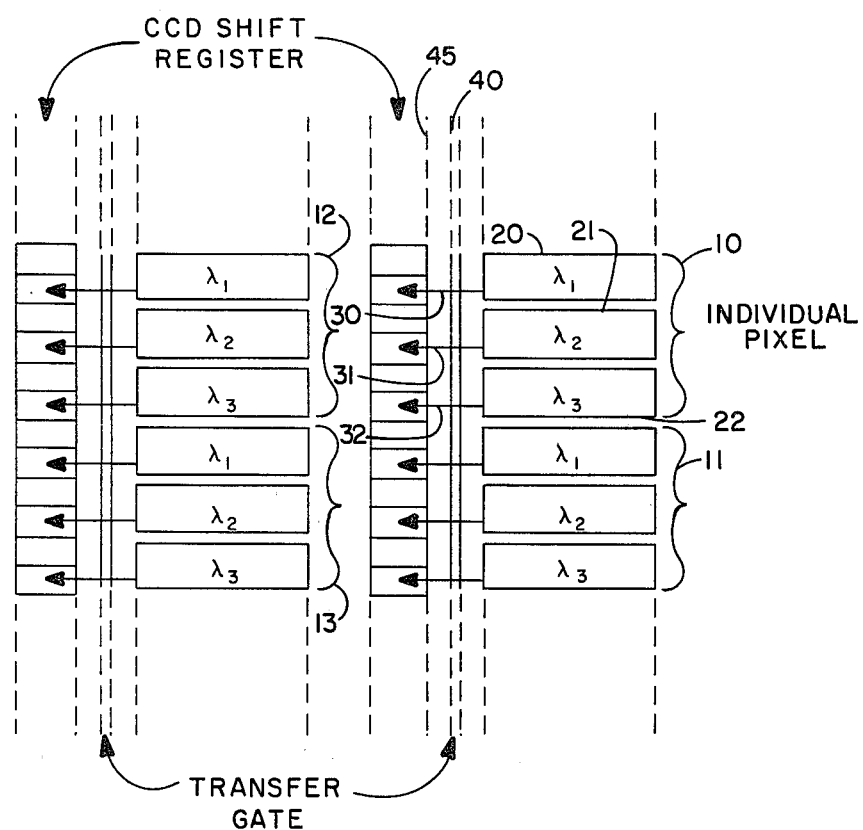
FIG. 1 shows a portion of a detector array of the present invention.

FIG. 1 shows a portion of a detector array similar to that found in the above-mentioned Roosild patent and containing four individual pixels identified by the brackets 10, 11, 12 and 13. Each pixel is composed of three Schottky barrier detectors as, for example, identified by reference numerals 20, 21 and 22 with respect to pixel 10. The three detectors in each pixel are labelled $\lambda 1$, $\lambda 2$ and $\lambda 3$ respectively to show that each has a different wavelength cutoff and thus is able to respond to a different infrared radiation wavelength and provide an output shown by arrows 30, 31 and 32 from detectors 20, 21 and 22 that pass through a transfer gate 40 to a CCD shift register 45. Thus by reading the contents of the shift register 45, the outputs of the three detectors of each pixel may be separated to provide signals indicative of "color" in the scene being viewed.

In the preferred embodiment, three detectors have been shown but it should be realized that the invention herein described comprises the use of two or more detectors in an individual pixel. Furthermore, in the preferred embodiment, the Schottky barrier detectors 20, 21 and 22 are comprised of palladium silicide, platinum silicide and iridium silicide on a p-type silicon base since these detectors respond to the 3 to 5 micron infrared window and since using these materials allows the whole array to be created simultaneously by virtue of the fact that the three described silicides can be fabricated with the same annealing schedule of about one hour at a temperature of 300 to 400 degrees centigrade. It should be realized, however, that other materials may be used with the Schottky barrier detectors to obtain similar color discrimination particularly if different windows are to be observed.

Figure 2:
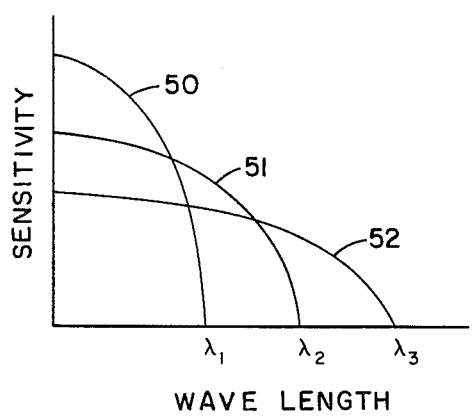
FIG. 2 shows the spectral response curve for the materials used in the Schottky barrier detectors of FIG. 1.

FIG. 2 shows the spectral response of three different detectors by curves 50, 51 and 52 respectively plotted in a graph of sensitivity versus wavelength. It is seen that curve 50 has a spectral cutoff $\lambda 1$ that falls short of the spectral cutoff of curve 51 at $\lambda 2$ and that, in turn, falls short of the spectral cutoff of curve 52 at $\lambda 3$. Thus, the detector represented by curve 50 will respond to wavelengths up to $\lambda 1$ while the detector represented by curve 51 will respond to wavelengths up to $\lambda 2$ and the detector represented by curve 52 will respond to wavelengths up to $\lambda 3$. In the case of palladium silicide Schottky barrier detector, $\lambda 1$ would be about 3.5 microns, with platinum silicide $\lambda 2$ would be about 4.6 microns and with iridium silicide $\lambda 3$ would be about 5.9 microns. Thus, the output of the detector array will include three signals each containing components different from the other detectors for each individual pixel and these three signals may then be used to provide "color" discrimination of the target being viewed. The readout from the CCD shift register may produce signals which would be fed to state-of-the art electronics to maintain the separation of the signals and with state-of-the art techniques, such as found in color television, the remote radiation emitting object may be viewed in "color" to provide for greater discrimination between targets.

The advantage of the arrangement described in FIG. 1 is that the arrangement allows construction of (a) monolithic detector/CCD structure using conventional silicon IC processing techniques, (b) apparatus which eliminates the use of cold external filters for spectral discrimination, (c) silicide detectors which use common fabrication processing and (d) integrated circuitry at each pixel for on-chip spectral separation for target discrimination.

It is therefore seen that I have provided a multi-spectral Schottky barrier IR detector array in which individual pixels may be composed of two or more detectors each responsive to a different wavelength cutoff to provide "color" discrimination. Many modifications or alterations to the structure shown in the preferred embodiment will occur to those skilled in the art. It should, therefore, be understood that I do not wish to be limited to the specific disclosure used in connection with the preferred embodiments but wish only to be limited by the following claims.

The embodiments of the invention in which an exclusive property or right is claimed are defined as follows:

1. An infrared detector array comprising:
   a plurality of pixels for sensing infrared radiation, each pixel comprising a plurality of Schottky barrier detectors, each detector in a pixel having a different barrier height so as to produce an output for each pixel indicative of infrared radiation of a different wavelength.

2. Apparatus according to claim 1 including means for transferring the outputs of the detectors to a shift register for readout.

3. Apparatus according to claim 1 wherein each pixel comprises two or more detectors with each of the detectors having a different infrared wavelength cutoff.

4. Apparatus according to claim 1 wherein the detectors have a substantially common annealing schedule.

5. Apparatus according to claim 3 wherein the detectors are comprised of palladium silicide, platinum silicide and iridium silicide on a p-type silicon base respectively.

6. A monolithic infrared detector CCD structure comprising:
   a first plurality of Schottky barrier detectors having an infrared response cutoff of $\lambda 1$;
   a second plurality of Schottky barrier detectors having an infrared response cutoff of $\lambda 2$, a plurality of pixels formed on the structure with each pixel comprising a detector of the first plurality and a detector of the second plurality;
   shift register means; and
   transfer means for transferring the outputs of each detector to the shift register for further utilization.

7. Apparatus according to claim 6 wherein the first plurality of detectors and the second plurality of detectors have a substantially common annealing schedule.

8. Apparatus according to claim 7 wherein the first and second plurality of detectors are chosen from a group consisting of palladium silicide, platinum silicide and iridium silicide on a p-type silicon base.

9. Apparatus according to claim 6 including a third plurality of Schottky barrier detectors and each of the plurality of pixels includes one of the third plurality of detectors.

10. Apparatus according to claim 9 wherein the first plurality of detectors comprises palladium silicide on a p-type silicon base, the second plurality of detectors comprises platinum silicide on a p-type silicon base and the third plurality of detectors comprises iridium silicide on a p-type silicon base.

* * * * *